(12) United States Patent
Jeunink et al.

(10) Patent No.: US 7,084,952 B2
(45) Date of Patent: Aug. 1, 2006

(54) LITHOGRAPHIC APPARATUS, DEVICE MANUFACTURING METHOD, AND COMPUTER-READABLE STORAGE MEDIUM

(75) Inventors: Andre Jeunink, Bergeyk (NL); Frank Commissaris, Waalre (NL); Vera Lemmen, Eindhoven (NL); M'Hamed Akhssay, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 49 days.

(21) Appl. No.: 10/712,264

(22) Filed: Nov. 14, 2003

(65) Prior Publication Data
US 2005/0018163 A1    Jan. 27, 2005

Related U.S. Application Data

(63) Continuation-in-part of application No. 10/624,893, filed on Jul. 23, 2003, now Pat. No. 6,788,383.

(51) Int. Cl.
G03B 27/32 (2006.01)
G03B 27/42 (2006.01)
G03B 27/52 (2006.01)

(52) U.S. Cl. .................... 355/30; 355/53; 355/55; 355/77; 430/5

(58) Field of Classification Search ............... 355/30, 355/53, 55, 77; 430/5
See application file for complete search history.

(56) References Cited

U.S. PATENT DOCUMENTS

| 4,825,247 | A | * | 4/1989 | Kemi et al. | 355/55 |
| 5,710,620 | A | * | 1/1998 | Taniguchi | 355/53 |
| 5,854,671 | A | * | 12/1998 | Nishi | 355/53 |
| 2002/0005940 | A1 | * | 1/2002 | Hatada et al. | 355/55 |

* cited by examiner

*Primary Examiner*—Rodney Fuller
(74) *Attorney, Agent, or Firm*—Pillsbury Winthrop Shaw Pittman, LLP

(57) ABSTRACT

The change in a property of a lithographic apparatus (e.g. the change in magnification of the projection system due to lens heating effects) is predicted, and when the change since the last time an alignment task was performed is greater than a threshold, an additional alignment task is carried out. A realignment is triggered when the predictive correction, and hence the error in it, becomes larger than a desired maximum. This avoids unnecessary realignments but ensures that an alignment does occur when likely errors are out of permitted ranges.

38 Claims, 2 Drawing Sheets

LITHOGRAPHIC APPARATUS, DEVICE MANUFACTURING METHOD, AND COMPUTER-READABLE STORAGE MEDIUM

RELATED APPLICATIONS

This application is a continuation-in-part of application Ser. No. 10/624,893 filed Jul. 23, 2003, which has issued as U.S. Pat. No. 6,788,383.

BACKGROUND

1. Field of the Invention

This invention relates to lithography.

2. Background Information

The term "patterning device" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and PCT patent application WO 98/40791, incorporated herein by reference.

When a lithographic apparatus is operating, the elements of the projection system heat up, due to the absorption of energy from the projection beam and in spite of temperature controlled cooling systems, and this affects their optical properties. The change in optical properties of the elements naturally affects the image that is projected, principally by causing a change in the image characteristics, of which magnification is particularly important. This lens heating effect can be calibrated and compensated for very well, e.g. by adjusting the positions of lens elements to effect a compensating change in magnification or other parameters of the projection system. See for example European patent application EP 1 164 436 A. The lens heating effects depend on lens properties, which are calibrated when the apparatus is constructed and may be recalibrated periodically thereafter, and parameters of the exposures carried out, such as mask transmission, dose, illumination settings, field size and substrate reflectivity. The latter parameter is difficult to predict and calibration of it is time consuming.

In view of the difficulties in calibrating the substrate reflectivity the apparatus may be operated with an inaccurate value of this parameter. This leads to a large error in the lens heating prediction which is compensated for by carrying out additional alignment steps prior to exposure of each substrate. This is also time consuming and hence results in a loss of throughput.

SUMMARY

In a method according to one embodiment of the invention, the change in a property of a lithographic apparatus (e.g. the change in magnification of the projection system due to lens heating effects) is predicted, and when the change since the last time an alignment task was performed is greater than a threshold, an additional alignment task is carried out. Such a method thereby triggers a realignment when the predictive correction, and hence the error in it, becomes larger than a desired maximum. This technique avoids unnecessary realignments but ensures that an alignment does occur when likely errors are out of permitted ranges.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An arrangement or method according to one embodiment of the present invention may be used, for example, to compensate for errors in predictive compensations based on imprecisely known parameters and/or to reduce the throughput loss caused by additional alignment steps in device manufacturing using lithographic projection apparatus.

Figure 1:
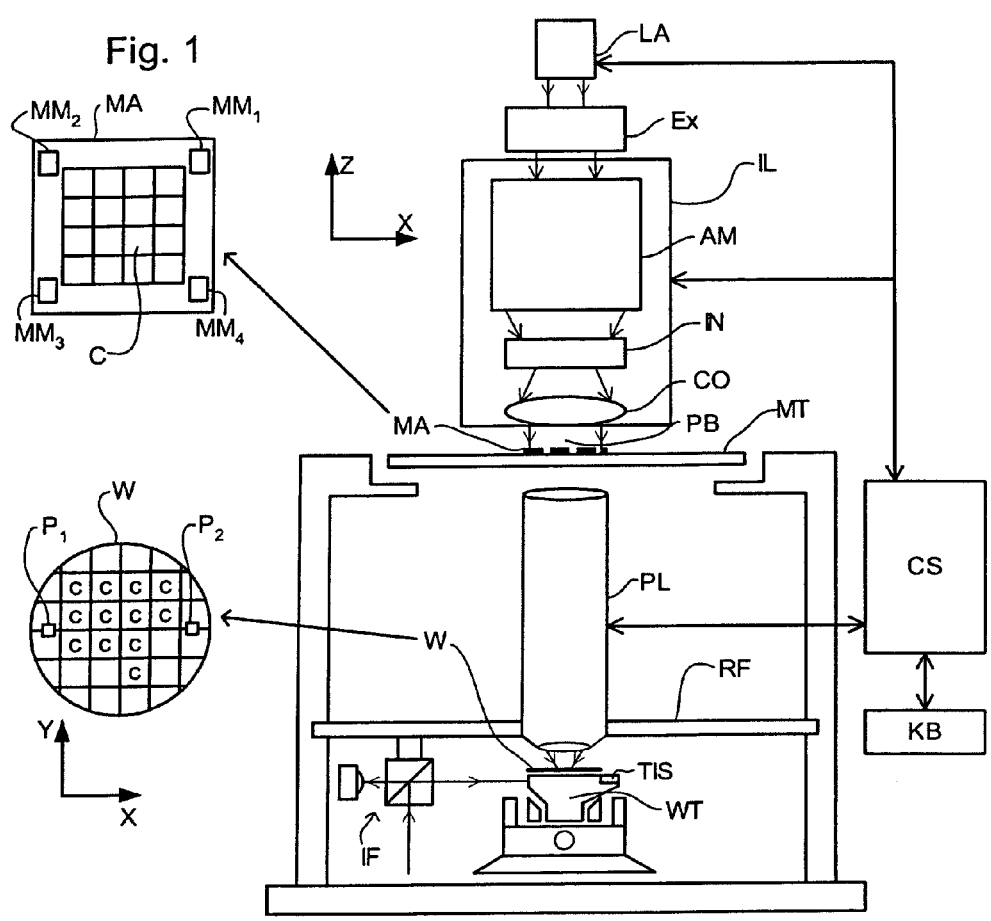
FIG. 1 depicts a lithographic projection apparatus according to an embodiment of the invention.

FIG. 1 schematically depicts a lithographic apparatus 5 according to a particular embodiment of the invention. The apparatus comprises:

a radiation system Ex, IL, for supplying a projection beam PB of radiation (e.g. DUV radiation), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at one time (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The apparatus as a whole is controlled by control system CS, which may take the form of a suitably programmed computer system. The control system CS receives data of jobs to be performed, e.g. via a keyboard KB, via a data carrier such as a diskette or CD-ROM, or via a network in the factory or fab, and controls the various sub-systems of the lithographic apparatus to perform the desired exposures. Among the numerous tasks performed by the control system CS is to predict the effect on the magnification of the projection system PL of heating of its elements.

Although the projection system includes a temperature control system to maintain its average temperature very constant, e.g. with ±0.1° C., as the apparatus performs exposures, the elements of the projection system absorb energy from the projection beam and temperature gradients arise. In some critical elements of the projection system, the projection beam is localized, dependent on the pattern being imaged and the illumination settings used, leading to localized heating of the elements. Such localized heating can lead to localized changes in the shape and/or optical properties of the elements leading to changes in the optical effect of the projection system. These changes principally manifest as changes in magnification but other changes also occur.

The control system therefore predicts the heating effects that will occur in performing a series of exposures and applies appropriate corrections, e.g. via controllable elements of the projection system. The prediction of the heating effects is based on details of the exposures to be carried out, e.g. information relating to the mask transmission, the desired dose at substrate level, field size, illumination settings such as the mode (e.g. conventional, annular, dipole, or quadrupole), etc. Another important factor is the reflectivity of the substrate, which determines how much energy is reflected back into the projection system. This factor is difficult to predict because it depends on the resist applied to the substrate and the exact process layers that have already been formed. Measurements of the substrate reflectivity can be performed and/or the heating effect calibrated for a particular substrate or batch but these procedures are time consuming. If an inaccurate value for the substrate reflectivity is used, the heating prediction will be in error and the correction(s) applied to the projection system may fail to fully correct the lens heating effects or even make matters worse.

According to an embodiment of the invention, the control system monitors the heating prediction and when a correction greater than a certain amount is predicted, an alignment task, which, among other things, effectively determines the actual magnification of the projection system at that time, is carried out. The threshold for the heating correction is set by the user (normally as a so-called "machine constant" which will be applied for all processes carried out by the tool, though it is possible to change the threshold from time to time) such that the likely error in the heating correction stays within permissible limits. For example, if a permissible error in the heating correction is 0.2 ppm (parts per million) and the likely uncertainty in the prediction is 40%, the alignment task is carried out when the heating correction reaches 0.5 ppm (40% of 0.5 ppm=0.2 ppm).

Since the alignment task determines the actual magnification of the projection system at that time, including the heating effect, a correction can be applied to subsequent predictions of the magnification and subsequent realignments are based on the change in predicted magnification since the last alignment task. The correction applied to the projection system is determined to compensate for a magnification change as follows:

$$\Delta M_{tot} = \Delta M_p + \Delta M_m \qquad (1)$$

where $\Delta M_p$ is the current prediction of the magnification change due to heating effects and $\Delta M_m$ is the difference between the measured magnification derived from the last alignment task and the predicted magnification change due to heating at that time.

Figure 2:
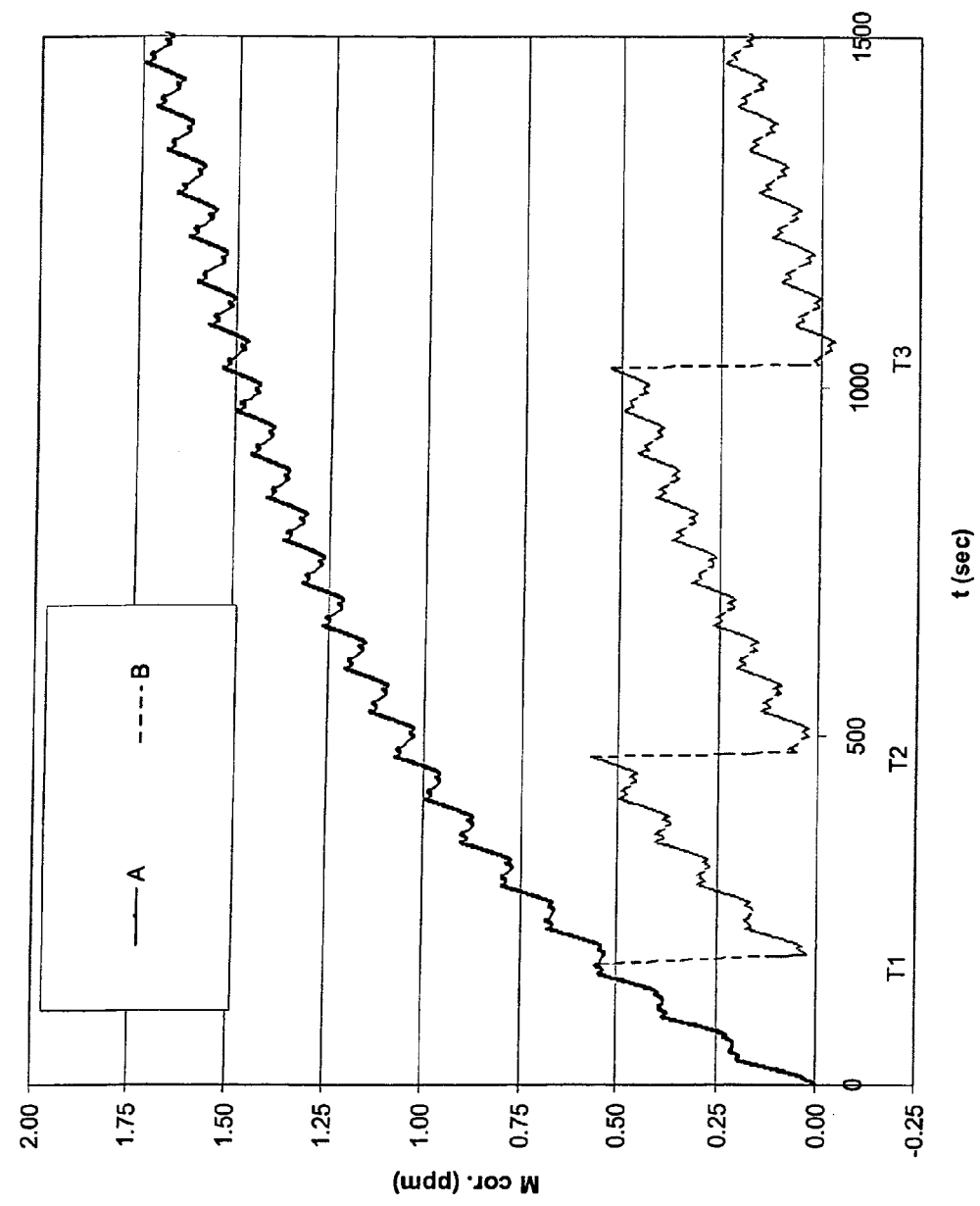
FIG. 2 is a graph of lens heating magnification change with time indicating the occurrence of alignment tasks according to an embodiment of the invention.

FIG. 2 illustrates the effect of an embodiment of the present invention. Curve A, solid line, shows the predicted heating effect in ppm which generally rises from an initial value of zero during the course of a series of exposures. When this passes a threshold, in this example of 0.5 ppm, at time T1 an alignment task is carried out. Curve B, dashed line, shows the change in the predicted heating effect since the last realignment. When this curve again passes the threshold, at times T2 and T3, further alignment tasks are carried out. It will be seen that the intervals between alignment tasks triggered according to an embodiment of the invention increase as the heating effect saturates and that beyond a certain point, when the heating prediction no longer changes by the amount of the threshold, no further alignment tasks will be carried out.

The alignment task that is performed in response to the trigger based on lens heating includes, in an implementation of this embodiment, a four point alignment that determines the position and size of the aerial image of the mask relative to the substrate table. The mask includes, preferably in its four corners, four alignment markers $MM_1$ to $MM_4$, images of which are projected to substrate level. The substrate table carries an image sensor, such as a transmission image sensor TIS, which is scanned in three-dimensions to determine the position of the aerial image of each mark in three dimensions. From these results, the magnification and other relevant parameters of the projection lens can be determined.

In the normal course of events, the four point alignment is only performed when a new mask is loaded onto the apparatus. If the lens heating prediction is sufficiently accurate, the position and size of the aerial image can be assumed stable and it is only necessary to perform a single point alignment when subsequent substrates of the batch are loaded. The single point alignment determines the relative position of the substrate table and the aerial image, which is necessary as this may become indeterminate during substrate exchange. Subsequent four point alignments are carried out only as necessary—in the past these have been carried out each time a substrate is exchanged if the lens heating is insufficiently accurate.

In the embodiment of the invention described in relation to FIG. 2, the threshold is fixed at 0.5 ppm. In an alternative embodiment of the invention the threshold may be allowed to vary, the variation being dependent upon how well the predicted magnification change follows the actual magnification change. In one such arrangement, for example, if the predicted magnification change corresponds closely with the actual magnification change then the threshold is increased. Conversely, if the predicted magnification change is found not to correspond well with the actual magnification change then the threshold is decreased.

Referring to FIG. 2, when the predicted heating correction (magnification) reaches 0.5 ppm a realignment is performed, and the measured magnification is compared with the predicted magnification. If the difference between the measured magnification and the predicted magnification is found to be 20%, instead of the expected 40%, then the threshold is increased from 0.5 ppm to 1 ppm (20% of 1 ppm=0.2 ppm). Referring to FIG. 2, this would mean that the threshold is increased to 1 ppm, and that the next realignment will occur at approximately 1000 seconds.

If the difference between the measured magnification and the predicted magnification is found to be 60%, instead of the expected 40%, then the threshold is decreased from 0.5 ppm to 0.33 ppm (60% of 0.33 ppm=0.2 ppm). Referring to FIG. 2, this would mean that the threshold is decreased to 0.33 ppm, and that the next realignment will occur at approximately 350 seconds.

The adjustment of the threshold may be determined automatically by the control system CS.

In the above described embodiments of the invention, the predicted heating correction (magnification) is fixed, with the threshold being allowed to vary. In other words, the shape of Curve A in FIG. 2 does not change.

In a further development of the invention, the predicted heating correction itself is adjusted depending upon the measured differences between the predicted and the measured heating correction during each realignment. For example, for a given batch of substrates having a particular set of process layers, realignment may occur three times based upon the predicted heating correction. This gives three values of the difference between the predicted and the measured heating correction. These are used to adjust the predicted heating correction (i.e. adjust the shape of the curve shown in FIG. 2) so that it more accurately reflects the actual heating correction. The adjusted model is stored and referenced to the substrate batch type, i.e. the particular set of process layers on the substrates, and is subsequently used whenever a series of exposures are to be applied to a substrate batch of that type. Different adjusted models are generated and stored each time a different substrate batch type is introduced to the lithographic apparatus.

The embodiment of the invention described above may be applied to embodiments of the invention described further above.

While specific embodiments of the invention have been described above, it will be appreciated that the invention may be practiced otherwise than as described. For example, the invention may be employed with other parameters for which predictive corrections are made and which may be measured by other sensors. The description is not intended to limit the invention.

What is claimed is:

1. A lithographic projection apparatus comprising:
   a projection system configured to project a patterned beam of radiation onto a target portion of a substrate;
   an alignment system;
   a control system configured to generate a predicted change in a time-varying property of a part of said apparatus;
   a comparator configured to compare a value, based on the predicted change, to a threshold and to generate a trigger signal when the value is greater than the threshold; and
   a threshold adjustor that is configured to adjust the threshold according to a relation between a measurement of the time-varying property and the predicted change in the time-varying property, wherein said alignment system is configured to perform an alignment task in response to the trigger signal.

2. The lithographic projection apparatus according to claim 1, wherein the alignment task includes obtaining a measurement of the time-varying property.

3. The lithographic projection apparatus according to claim 1, wherein the threshold is reduced in response to a determination that a distance between the measurement of the time-varying property and the value based on the predicted change is greater than a second threshold.

4. The lithographic projection apparatus according to claim 1, wherein the threshold is increased in response to a determination that a distance between the measurement of the time-varying property and a value, based on the predicted change, is less than a second threshold.

5. The lithographic projection apparatus according to claim 1, wherein the control system is configured to increase the threshold by an increment, and wherein the increment is adjustable.

6. The lithographic projection apparatus according to claim 5, wherein the increment is reduced in response to a determination that a distance between the measurement of the time-varying property and the value, based on the predicted change, is greater than a second threshold.

7. The lithographic projection apparatus according to claim 5, wherein the increment is increased in response to a determination that a distance between the measurement of the time-varying property and the value, based on the predicted change, is less than a second threshold.

8. The lithographic projection apparatus according to claim 1, wherein, in response to the predicted change in the time-varying property, the apparatus is configured to compensate for a change in the time-varying property.

9. The lithographic projection apparatus according to claim 1, wherein, in response to the predicted change in the time-varying property, the apparatus is configured to adjust a position of (1) a mask having the pattern of the patterned beam, (2) the substrate, (3) an element of said projection system, or (4) any combination of (1) to (3).

10. The lithographic projection apparatus according to claim 1, wherein, in response to the predicted change in the time-varying property, the apparatus is configured to compensate for a change in the time-varying property relative to a most recent measurement of the time-varying property.

11. The lithographic projection apparatus according to claim 1, wherein, in response to the predicted change in the time-varying property, the apparatus is configured to compensate for a change in the time-varying property relative to a most recent performance of the alignment task.

12. The lithographic projection apparatus according to claim 1, wherein the time-varying property includes a temperature-dependent property of said projection system.

13. The lithographic projection apparatus according to claim 12, wherein the temperature-dependent property includes an optical property.

14. The lithographic projection apparatus according to claim 13, wherein the optical property includes a magnification.

15. The lithographic projection apparatus according to claim 1, wherein said alignment system is adapted to perform a first alignment task and a second alignment task that provides a larger number of measurements than the first alignment task, and
wherein said alignment system is adapted to perform the second alignment task in response to the trigger signal.

16. A lithographic projection apparatus comprising:
a projection system configured to project a patterned beam of radiation onto a target portion of a substrate;
an alignment system;
a control system configured to generate a predicted change in a time-varying property of a part of said apparatus;
a comparator configured to compare a value, based on the predicted change, to a threshold and to generate a trigger signal when the value is greater than the threshold; and
an adjustor that is configured to determine a modified predicted change in the time-varying property, based on a measurement of the time-varying property, and is configured to adjust a threshold according to a relation between a measurement of the time-varying property and the predicted change in the time-varying property, wherein the alignment system is configured to perform an alignment task in response to the trigger signal.

17. The lithographic projection apparatus according to claim 16, wherein the control system is configured to store a modified value, based on the modified predicted change, and
wherein the apparatus is configured to perform an operation on a second substrate according to the modified value.

18. The lithographic projection apparatus according to claim 16, wherein the adjustor is configured to determine a plurality of modified predicted changes in the time-varying property and to store a plurality of modified values based on a corresponding one of the modified predicted changes, and
wherein the apparatus is configured to perform an operation on a second substrate according to a selected one among the plurality of modified values.

19. The lithographic projection apparatus according to claim 16, wherein, in response to the predicted change in the time-varying property, the apparatus is configured to compensate for a change in the time-varying property.

20. The lithographic projection apparatus according to claim 16, wherein, in response to the predicted change in the time-varying property, the apparatus is configured to compensate for a change in the time-varying property relative to a most recent measurement of the time-varying property.

21. The lithographic projection apparatus according to claim 16, wherein said time-varying property includes a temperature-dependent property of said projection system.

22. The lithographic projection apparatus according to claim 21, wherein the temperature-dependent property includes an optical property.

23. The lithographic projection apparatus according to claim 22, wherein the optical property includes a magnification.

24. The lithographic projection apparatus according to claim 16, wherein said alignment system is adapted to perform a first alignment task and a second alignment task that provides a larger number of measurements than said first alignment task, and
wherein said alignment system is adapted to perform said second alignment task in response to said trigger signal.

25. A device manufacturing method using a lithographic projection apparatus, the method comprising:
providing a substrate that is at least partially covered by a layer of radiation-sensitive material;
using a projection system to project a patterned beam of radiation onto a target portion of the layer of radiation-sensitive material;
generating a predicted change of a time-varying property of a part of said apparatus at a time of a particular exposure;
obtaining a threshold value;
detecting when a value based on the predicted change exceeds the threshold value;
enabling adjustment of the threshold value;
adjusting the threshold value according to a relation between a measurement of the time-varying property and the value based on the predicted change; and
performing an alignment task in response to said detecting.

26. The device manufacturing method according to claim 25, wherein the alignment task includes obtaining a measurement of the time-varying property.

27. The device manufacturing method according to claim 25, further comprising reducing the threshold value in response to a determination that a distance between a measurement of the time-varying property and the value based on the predicted change is greater than a second threshold.

28. The device manufacturing method according to claim 25, further comprising increasing the threshold value in response to a determination that a distance between a measurement of the time-varying property and the value based on the predicted change is less than a second threshold.

29. The device manufacturing method according to claim 25, further comprising increasing the threshold value by an increment, and wherein the increment is adjustable.

30. The device manufacturing method according to claim 29, further comprising reducing the increment in response to a determination that a distance between a measurement of the time-varying property and the value based on the predicted change is greater than a second threshold.

31. The device manufacturing method according to claim 29, further comprising increasing the increment in response to a determination that a distance between a measurement of the time-varying property and the value based on the predicted change is less than a second threshold.

32. The device manufacturing method according to claim 25, further comprising, performing the alignment task to compensate for the change in the time-varying property relative to a most recent measurement of the time-varying property.

33. The device manufacturing method according to claim 25, wherein said time-varying property includes a temperature-dependent property of the projection system.

34. The device manufacturing method according to claim 33, wherein the temperature-dependent property is a magnification.

35. A device manufacturing method using a lithographic projection apparatus, the method comprising:
providing a substrate that is at least partially covered by a layer of radiation-sensitive material;
using a projection system to project a patterned beam of radiation onto a target portion of the layer of radiation-sensitive material;
generating a predicted change of a time-varying property of a part of said apparatus at a time of a particular exposure;
adjusting an aspect of the apparatus based on the predicted change of the time-varying property;
obtaining a threshold value;
detecting when a value based on the predicted change exceeds the threshold value;
performing an alignment task in response to said detecting;
enabling adjustment of the threshold value;
adjusting the threshold value according to a relation between a measurement of the time-varying property and the value based on the predicted change; and
determining a modified predicted change in the time-varying property based on a measurement of the time-varying property.

36. The device manufacturing method according to claim 35, further comprising compensating for a change in the time-varying property relative to a most recent measurement of the time-varying property.

37. The device manufacturing method according to claim 35, wherein said time-varying property includes a temperature-dependent property of the projection system.

38. The device manufacturing method according to claim 37, wherein the temperature-dependent property is a magnification.

* * * * *